__United States Patent__ [19]

Dielhof

[11] Patent Number: 4,518,923
[45] Date of Patent: May 21, 1985

[54] PREAMPLIFIER
[75] Inventor: Pieter B. Dielhof, Breda, Netherlands
[73] Assignee: U.S. Philips Corporation, New York, N.Y.
[21] Appl. No.: 458,122
[22] Filed: Jan. 14, 1983
[30] Foreign Application Priority Data
  Feb. 19, 1982 [NL] Netherlands .......................... 8200670
[51] Int. Cl.³ ............................ H03F 1/02; H03F 1/34
[52] U.S. Cl. ......................................... 330/9; 330/293
[58] Field of Search ...................... 330/9, 85, 100, 277, 330/293, 286

[56] References Cited
FOREIGN PATENT DOCUMENTS
  2024552  1/1980  United Kingdom ................ 330/286

Primary Examiner—James B. Mullins
Assistant Examiner—G. Wan
Attorney, Agent, or Firm—Thomas A. Briody; William J. Streeter

[57] ABSTRACT

A preamplifier for a periodically varying input signal (PS), has an input terminal (4) connected to a control electrode (g) of a voltage-controlled transistor (6) and to a terminal (7) of a resistor (8) which form part of a first preamplifier stage (6–16). An output electrode (d) of the transistor (6) and a further terminal (9) of the resistor (8) are coupled to an input (17) and output terminal (18), respectively of a second preamplifier stage (17–49) via separate direct current connections. An output terminal (5) of the preamplifier is on the one hand fedback to the said input terminal (17) of the second stage (17–49) via a signal clamping circuit (49) and on the other hand has a direct current connection to the said output terminal (18) of the second stage (17–49). The voltage-controlled transistor (6) is supplied with such a gate-source bias voltage (Vgs) that the optimum signal-to-noise ratio for the output signal (APS) is present. In addition, the signal clamping circuit (49) comprises a controllable current source (48) arranged at the output (43) thereof, which current source (48) is employed for feeding the said transistor (6) and a current-controlled transistor (19) which is connected to the input terminal (17) of the second stage (17–49).

6 Claims, 1 Drawing Figure

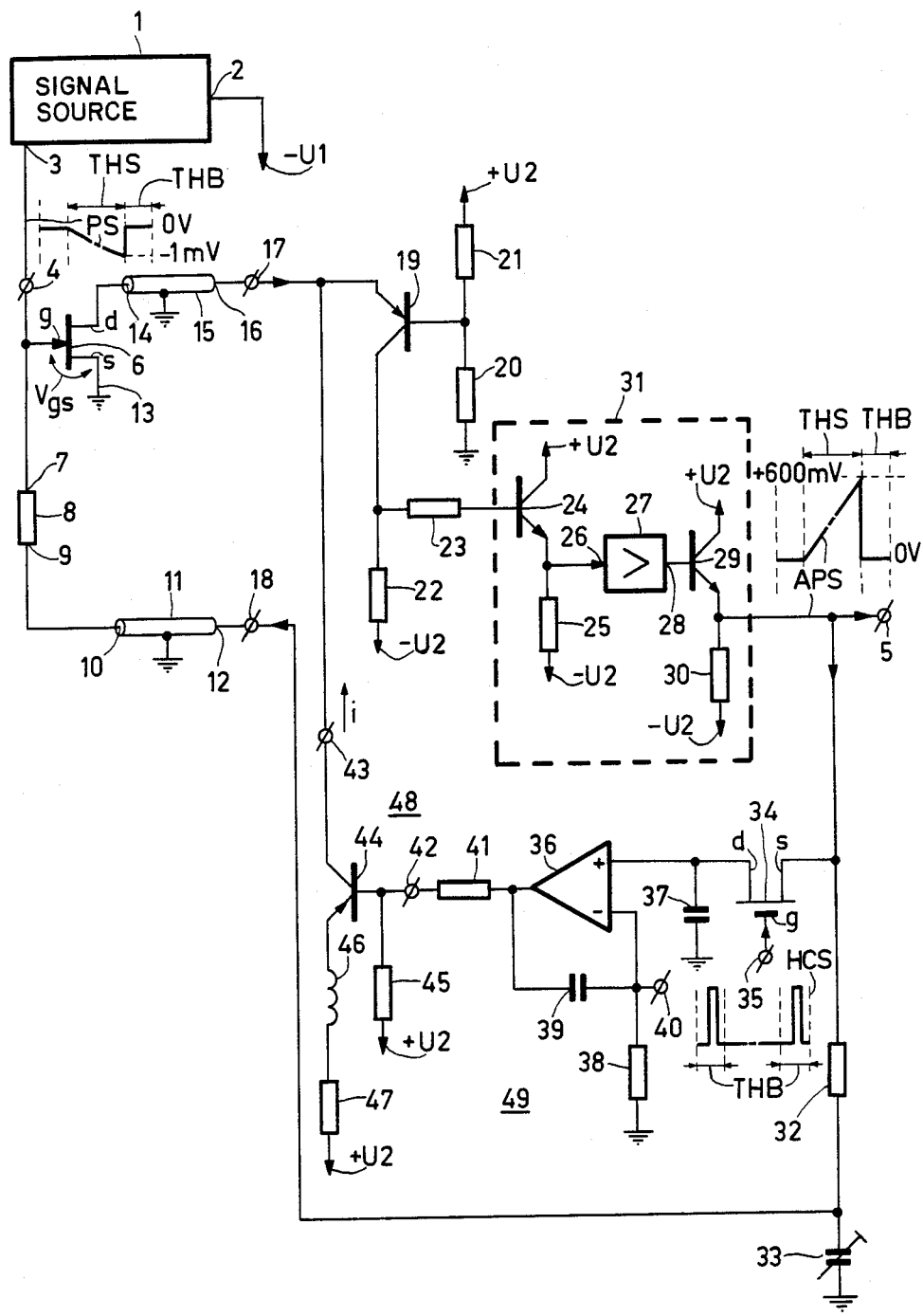

PREAMPLIFIER

BACKGROUND OF THE INVENTION

The invention relates to a preamplifier having an input terminal for receiving a periodically varying input signal to be amplified, which input terminal is connected to at least one control electrode of a voltage-controlled transistor and to a terminal of a resistor, the transistor and the resistor forming part of a first stage of the preamplifier, an output electrode of this transistor being coupled to an input terminal of a second stage of the preamplifier via a direct current connection, an output terminal of the second stage being coupled to a further terminal of the resistor via a direct current connection, which preamplifier has an output terminal for supplying the amplified input signal, the preamplifier comprising a fedback signal clamping circuit which is fedback from the output terminal of the preamplifier for periodically clamping a signal level in the amplified signal at this output terminal at a reference voltage.

Such a preamplifier employed in a television camera is described in "Journal of the SMPTE", July 1973, pages 547 to 551, inclusive, more specifically on pages 548 (FIG. 4) and 549 (FIG. 6). The voltage-controlled transistor, which has an insulated gate electrode, is arranged near a television pick-up arrangement to which the gate electrode, being the control electrode, is connected. The input signal of the preamplifier is a television picture signal. The drain or output electrode of the transistor and the adjacent resistor are connected via a multi-wire cable which acts as a direct current connection, to the terminals of the second stage of the preamplifier, which stage is located at some distance. A third stage of the preamplifier formed by differential amplifiers is arranged subsequent to the second stage which comprises discrete transistors, an output terminal of the third stage forming the amplified picture signal-carrying output terminal of the preamplifier. The signal clamping circuit, which is fed from the output terminal of the preamplifier, is fedback to an input terminal of the second stage. When the preamplifier is used for television, as described, the signal clamping circuit causes, in the amplified picture signal, the black level present in line blanking periods to be clamped onto the reference voltage.

SUMMARY OF THE INVENTION

The invention has for its object to provide a preamplifier, the signal clamping circuit not only being employed for its actual function, namely the function of signal level clamping at the output terminal of the preamplifier, but also for obtaining an optimum signal-to-noise ratio for the amplified signal at the preamplifier output terminal. According to the invention, an embodiment of a preamplifier is characterized in that the fedback signal clamping circuit is present between said output terminal of the preamplifier and said input terminal of the second stage of the preamplifier and said output terminal of the preamplifier has a direct current connection to said output terminal of the second stage of the preamplifier.

Feeding back the signal clamping circuit from the preamplifier output to the input terminal of the second stage, on the one hand, and, on the other hand, providing the direct current connection to the output terminal of the second stage, results in that such a bias voltage can be produced by the voltage-controlled transistor in the first stage that this transistor operates with the maximum slope of the input-output voltage characteristic, which results in an optimum signal-to-noise ratio.

If one wants to clamp the signal level in the amplified signal onto a predetermined, first reference voltage, an embodiment of the preamplifier in accordance with the invention, a source electrode of the voltage-controlled transistor being connected to a terminal carrying a second reference voltage and a gate electrode being the control electrode, is characterized in that the transistor is of a type which has the maximum slope of the input-output voltage characteristic at a gate-source bias voltage which is substantially equal to the difference between the first-mentioned reference voltage and the second reference voltage.

A further embodiment may be characterized in that the first and second reference voltages are equal to substantially zero volt.

An embodiment of a preamplifier in accordance with the invention comprising a signal clamping circuit which does not only operate as a power supply circuit for the first preamplifier stage but which, in addition, operates as a supply circuit for the second preamplifier stage, the signal clamping circuit comprising a switching transistor which is only conductive during periodic signal blanking periods and which is arranged between the preamplifier output terminal and an input of a differential amplifier incorporated in a signal integration circuit, to a further input of which substantially the reference voltage is applied, in the second stage of the preamplifier, a control electrode of a current controlled transistor being connected to the input terminal thereof, is characterized in that the signal clamping circuit comprises a controllable current source having a control input terminal and a current output terminal, the control input terminal being coupled to the output of the differential amplifier and the current output terminal being connected to the input terminal of the second stage of the preamplifier, to which an emitter electrode being the control electrode of the current-controlled transistor is connected.

DESCRIPTION OF THE DRAWING

The invention will now be further described by way of example with reference to an embodiment of a preamplifier in accordance with the invention shown in the accompanying drawing.

DESCRIPTION OF THE PREFERRED EMBODIMENT

In the drawing, reference numeral 1 denotes a signal source which has a terminal 2 which is connected to a terminal carrying a —U1 supply voltage and a terminal 3 which is connected to an input terminal 4 of a preamplifier in accordance with the invention. The signal source 1 may incorporate a pick-up arrangement for use in television, facsimile, fibre optic transmission and the like. It is only important that the signal source 1 produces a periodically varying signal which is amplified in the preamplifier and applied to an output terminal 5 thereof with a predetermined signal level, which is periodically clamped onto a reference voltage. At the input terminal 4 there is shown, by way of example, a signal variation versus time of a signal PS applied thereto. Likewise, at the output terminal 5, there is shown an associated, amplified output signal APS. The signal PS is, for example, a picture signal such as is used in television. The signal source 1 then comprises a television pick-up arrangement which comprises, for example, a solid-state pick-up device or a pick-up tube, the signal source 1 then forming part of a black-white or color television camera. The terminal which carries the −U1 voltage and forms part of a voltage supply source U1, not shown, a further terminal of which is connected to ground, as will also hold for a supply voltage source U2, is connected in the signal source 1 to, for example, the cathode of an electron gun incorporated in a pick-up tube. The terminal 3 is connected to a target plate electrode incorporated in the pick-up tube and scanned by an electron beam. As the specific construction of the signal source 1 is not important for the invention, it will not be further described.

Let it be assumed that the signal PS is, for example, a television picture signal. In line blanking periods THB, at least in a portion thereof, there is then a black-level which is at, for example, the ground potential of OV. In line scanning periods THS, picture information is present in the signal PS and, by way of example, it is assumed that there is a linear change from the OV black level to a peak-white value located at −1 mV. Let it be assumed that at the black level no current flows to the terminal 3 and that at the peak-white value a current of, for example, 300 nA flows to the terminal 3. The amplified signal APS is shown in a similar way, in the inverted form, with a variation between OV and +600 mV, so that a gain factor equal to 600 is assumed. The periods THS and THB together form a television line period.

The input terminal 4 of the preamplifier is connected to a gate electrode g, which acts as a control electrode, of a voltage-controlled transistor 6 which is, for example, in the form of a field effect transistor, and to a terminal 7 of a resistor 8. A further terminal 9 of the resistor 8 is connected to a terminal 10 of a coaxial cable 11 which has a further terminal 12 and a shield which is connected to ground. A source electrode s of the transistor 6 is connected to a terminal 13 which is connected to ground, the OV ground potential being assumed to be a reference voltage. A drain electrode d of the transistor 6 is connected to a terminal 14 of a coaxial cable 15 which has a further terminal 16 and a shield which is connected to ground.

The transistor 6 and the resistor 8 form part of a first stage (6–16) of the preamplifier. The transistor 6 and the resistor 8 are arranged near the signal source 1 and the cables 15 and 11 form a direct current connection to an input terminal 17 and an output terminal 18, respectively of a remote, second stage of the preamplifier arranged between the input terminal 17 and the output terminals 5 and 18 which will be described hereinafter.

The input terminal 17 of the second preamplifier stage is connected to an emitter electrode, which acts as a control electrode, of a current controlled pnp-transistor 19. A base electrode of the transistor 19 is connected to ground and to a terminal which carries a supply voltage +U2, via respective resistors 20 and 21. A collector electrode of the transistor 19 is connected via a resistor 22 to a terminal which carries a supply voltage −U2 and via a resistor 23 to a base electrode of an npn-transistor 24. A collector electrode of the transistor 24 is connected to a terminal which carries the voltage +U2 and an emitter electrode of this transistor 24 is connected via a resistor 25 to a terminal which carries the voltage −U2. The emitter electrode of the emitter-follower transistor 24 is also connected to an input 26 of an amplifier circuit 27 which has an output 28. The output 28 is connected to a base electrode of an npn transistor 29 which, in combination with a resistor 30, operates as an emitter-follower between terminals carrying the voltages +U2 and −U2. The emitter electrode of the transistor 29 is connected to the output terminal 5 of the preamplifier. The amplifier circuit 27 and the emitter-follower transistors 24 and 29 form part of a third amplifier stage 31, whose construction will not be further described here. The amplifier circuit 27 comprises, for example, discrete transistors or discrete (differential) amplifiers.

The output terminal 5 of the preamplifier is connected to ground via the series-arrangement of a resistor 32 and a variable capacitor 33. The junction between the resistor 32 and the capacitor 33 is connected to the output terminal 18 of the second preamplifier stage. When the resistance values of the resistor 32 and the cable 11 are so low as to be neglected with respect to the value of the resistor 8, it follows that, assuming the current to the terminal 3 is 300 nA when the peak-white value is present, the value of the resistor 8 is equal to 2 MΩ. The variable capacitor 33 is provided to compensate for a parasitic capacitance across the resistor 8.

The output terminal 5 is further connected to a source electrode s of an MOS-transistor 34, which has a gate electrode g connected to a terminal 35 for the supply of a signal HCS shown next to it. The signal HCS has a pulse in the line blanking periods THB, more specifically in, for example, the second half thereof. During the pulses of the signal HCS, the switching transistor 34 has a conducting connection between the source electrode s and a drain electrode d, which is directly connected to a (+) input of a differential amplifier 36 and to ground via a capacitor 37. A (−) input of the differential amplifier 36 is connected to ground and to the differential amplifier output, respectively, via a resistor 38 and a capacitor 39, respectively. The (−) differential amplifier input is further connected to a terminal 40, to which, if so desired, a reference voltage deviating from the ground potential may be applied. The output of the amplifier 36 is connected via a resistor 41 to a control input terminal 42 of a controllable current source, which supplies a current i from a current output terminal 43. The terminal 42 is directly connected to a base electrode of a pnp-transistor 44 and via a resistor 45 to a terminal carrying the voltage +U2. The collector electrode of the transistor 44 is connected to the terminal 43 and the emitter electrode thereof is connected via a coil 46 arranged in series with a resistor 47 to a terminal carrying the voltage +U2. A controllable current source 48 is thus arranged between the terminals 42 and 43, the transistor 44 having for its object to obtain the correct current direction variation. An increase or a decrease, respectively, of the control voltage on the terminal 42 should result in a decrease or increase, respectively, of the current i at terminal 43. If, because of a preceding polarity reversal the transistor 44 might be omitted, it is sufficient to form a current source with the coil 46 and the resistor 47, the junction being connected to the terminal 42 and, for example, the coil 46 being directly connected to terminal 43.

Connected between the terminal 5 and the terminal 43, which is connected to the terminal 17, a signal clamping circuit 49 of the described construction is arranged which comprises the switching transistor 34, which is only conductive in the periodical signal blanking period THB, a signal integration circuit (36–39) and the controllable current source 48. The preamplifier comprises a second stage (17–23).

It is apparent that when the preamplifier has a construction as shown in the drawing, the output terminal 5 is on the one hand fedback to the input terminal 17 of the second preamplifier stage (17–49) via the signal clamping circuit 49 and, on the other hand, has a direct current connection to the output terminal 18 of the second stage (17–23) via the resistor 32. The signal clamping circuit 49 applies a current i with such a value to the transistors 6 and 19 together that in the signal APS, the OV ground potential occurs as a reference voltage in the line blanking periods THB. Via the direct current connection through the resistor 32, this ground potential is impressed on the gate electrode g of the transistor 6 when a current of substantially OA flows through resistors 8 and 32 and the cable 11. This results, the ground potential being present on the source electrode s thereof, in the transistor 6 having a gate-source bias voltage Vgs which is equal to OV. If now for the transistor 6 a type is used which has the maximum slope in the input-output voltage characteristic and if the bias voltage Vgs is equal to OV, then it is achieved that the preamplifier operates with the optimum signal-to-noise ratio.

For the case in which the transistor 6 is formed by a transistor which has a maximum slope at a bias voltage value deviating therefrom, this transistor can be adjusted thereto by making the deviating value equal to the difference between the voltages applied to the source electrode s and the gate electrode g of the transistor 6. While maintaining the OV ground potential as a (first) reference voltage at the signal APS, the source electrode s of the transistor 6 may be connected to a terminal (13) which carries a different, second reference voltage, the transistor 6 having the maximum slope at the difference between these two reference voltages.

The signal clamping circuit 49 differs from prior art fedback clamping circuits comprising a differential amplifier (36), in that it additionally comprises the controllable current source 48. Normally, as in the above-mentioned article, the differential amplifier output is connected via an adder resistor (41) to an amplifier input terminal (17) to which the signal to be amplified also is applied. The clamping circuit 49 does not only ensure clamping of the black level in the signal APS, but is also used for feeding transistors 6 and 19, as the emitter electrode of the current-controlled transistor 19 is connected to terminal 43 and the drain electrode d of the voltage-controlled transistor 6 is also connected to this terminal.

What is claimed is:

1. A preamplifier having an input terminal for receiving a periodically varying input signal to be amplified, which input terminal is connected to at least one control electrode of a voltage controlled transistor and to a terminal of a resistor, the transistor and the resistor forming part of a first stage of the preamplifier, an output electrode of this transistor being coupled to an input terminal of a second stage of the preamplifier via a direct current connection, an output terminal of the second stage being coupled to a further terminal of the resistor via a direct current connection, which preamplifier has an output terminal for supplying the amplified input signal, the preamplifier comprising a fedback signal clamping circuit, which is fedback from the output terminal of the preamplifier, for periodically clamping a signal level in the amplified signal at this output terminal at a first reference voltage, characterized in that the fedback signal clamping circuit is present between said output terminal of the preamplifier and said input terminal of the second stage of the preamplifier and said output terminal of the preamplifier has a direct current connection to said output terminal of the second stage of the preamplifier.

2. A preamplifier as claimed in claim 1 wherein the signal clamping circuit comprises a switching transistor which is only conductive during periodic signal blanking periods and which is arranged between the preamplifier output terminal and an input of a differential amplifier incorporated in a signal integration circuit, substantially the first reference voltage being applied to a further input of the differential amplifier, a control electrode of a current-controlled transistor in the second stage of the preamplifier being connected to the input terminal thereof, the signal clamping circuit further comprising a controllable current source having a control input terminal and a current output terminal, the control input terminal being coupled to the output of the differential amplifier and the current output terminal being connected to the input terminal of the second stage of the preamplifier, the control electrode of the current-controlled transistor being an emitter electrode.

3. A preamplifier as claimed in claim 1, in which a source electrode of the voltage-controlled transistor is connected to a terminal carrying a second reference voltage and a gate electrode is the said control electrode, wherein the transistor is of a type which has the maximum slope of the input-output voltage characteristic at a gate-source bias voltage which is substantially equal to the difference between the first reference voltage and the second reference voltage.

4. A preamplifier as claimed in claim 2, the first and second reference voltages are equal to substantially zero volts.

5. A preamplifier as claimed in claim 2, wherein the signal clamping circuit comprises a switching transistor which is only conductive during periodic signal blanking periods and which is arranged between the preamplifier output terminal and an input of a differential amplifier incorporated in a signal integration circuit, substantially the first reference voltage being applied to a further input of the differential amplifier, a control electrode of a current-controlled transistor in the second stage of the preamplifier being connected to the input terminal thereof, the signal clamping circuit further comprises a controllable current source having a control input terminal and a current output terminal, the control input terminal being coupled to the output of the differential amplifier and the current output terminal being connected to the input terminal of the second stage of the preamplifier, the control electrode of the current-controlled transistor being an emitter electrode.

6. A preamplifier as claimed in claim 2, wherein the signal clamping circuit comprises a switching transistor which is only conductive during periodic signal blanking periods and which is arranged between the preamplifier output terminal and an input of a differential amplifier incorporated in a signal integration circuit, substantially the first reference voltage being applied to a further input of the differential amplifier, a control electrode of a current-controlled transistor in the second stage of the preamplifier being connected to the input terminal thereof, the signal clamping circuit further comprises a controllable current source having a control input terminal and a current output terminal, the control input terminal being coupled to the output of the differential amplifier and the current output terminal being connected to the input terminal of the second stage of the preamplifier, the control electrode of the current-controlled transistor being an emitter electrode.

* * * * *